(12) United States Patent
Hu et al.

(10) Patent No.: US 11,923,422 B2
(45) Date of Patent: Mar. 5, 2024

(54) SEMICONDUCTOR DEVICE

(71) Applicant: GlobalWafers Co., Ltd., Hsinchu (TW)

(72) Inventors: Ming-Shien Hu, Taipei (TW); Chien-Jen Sun, Hsinchu (TW); I-Ching Li, Hsinchu (TW); Wen-Ching Hsu, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 253 days.

(21) Appl. No.: 17/027,712

(22) Filed: Sep. 22, 2020

(65) Prior Publication Data
US 2021/0005718 A1 Jan. 7, 2021

Related U.S. Application Data

(62) Division of application No. 15/077,932, filed on Mar. 23, 2016, now abandoned.

(30) Foreign Application Priority Data
Jun. 5, 2015 (TW) .................................. 104118251

(51) Int. Cl.
| H01L 29/207 | (2006.01) |
| H01L 29/20 | (2006.01) |
| H01L 29/36 | (2006.01) |
| H01L 29/778 | (2006.01) |
| H01L 29/10 | (2006.01) |

(52) U.S. Cl.
CPC .......... *H01L 29/207* (2013.01); *H01L 29/365* (2013.01); *H01L 29/1075* (2013.01); *H01L 29/2003* (2013.01); *H01L 29/7786* (2013.01)

(58) Field of Classification Search
CPC ............. H01L 29/1075; H01L 29/2003; H01L 29/207; H01L 29/365; H01L 29/7786
See application file for complete search history.

(56) References Cited

U.S. PATENT DOCUMENTS

| 2014/0158984 A1* | 6/2014 | Huang | ............. H01L 21/02458 257/17 |
| 2016/0197233 A1* | 7/2016 | Shur | ...................... H01L 33/06 438/37 |

\* cited by examiner

*Primary Examiner* — Meiya Li
(74) *Attorney, Agent, or Firm* — JCIPRNET

(57) ABSTRACT

A semiconductor device includes a substrate, an initial layer, and a superlattice stack. The initial layer is located on the substrate and includes aluminum nitride (AlN). The superlattice stack is located on the initial layer and includes a plurality of first films, a plurality of second films and at least one doped layer, and the first films and the second films are alternately stacked on the initial layer, wherein the at least one doped layer is arranged in one of the first films and the second films, and dopants of the at least one doped layer are selected from a group consisting of carbon, iron, and the combination thereof.

6 Claims, 9 Drawing Sheets

SEMICONDUCTOR DEVICE

CROSS-REFERENCE TO RELATED APPLICATION

This application is a divisional application of and claims the priority benefit of a prior application Ser. No. 15/077,932, filed on Mar. 23, 2016. The prior application Ser. No. 15/077,932 claims the priority benefit of Taiwan application serial no. 104118251, filed on Jun. 5, 2015. The entirety of each of the above-mentioned patent applications is hereby incorporated by reference herein and made a part of this specification.

TECHNICAL FIELD

The disclosure relates to a semiconductor device. More particularly, the disclosure relates to a semiconductor device with a superlattice stack.

DESCRIPTION OF RELATED ART

Nitride semiconductors are characterized by high electron saturation velocity and wide band gap and thus can be applied not only to light emitting semiconductor devices but also to compound semiconductor devices with high breakdown voltage and large power output. For instance, in a gallium nitride (GaN)-based high electron mobility transistor (HEMT), a GaN layer and an aluminum gallium nitride (AlGaN) layer are sequentially grown on the substrate in an epitaxial manner. Here, the GaN layer serves as an electron transport layer, and the AlGaN layer acts as an electron supply layer. Since the lattice constant of AlGaN is different from that of GaN, strain may be generated in the AlGaN layer. Due to piezoelectric polarization, two-dimensional electronic gas (2DEG) with high concentration is generated. Hence, the GaN-based HEMT is adapted to an apparatus with large output power.

SUMMARY OF THE DISCLOSURE

In an exemplary embodiment of the disclosure, a semiconductor device that includes a substrate, an initial layer located on the substrate, and a superlattice stack located on the initial layer is provided. The initial layer includes aluminum nitride (AlN), and the superlattice stack includes a plurality of first films and a plurality of second films. The first films and the second films are alternately stacked on the initial layer. At least one of the first films and the second films is a doped layer having dopants selected from a group consisting of carbon, iron, and the combination thereof, and the other films do not comprise dopants substantially.

In an exemplary embodiment of the disclosure, a semiconductor device that includes a substrate, an initial layer located on the substrate, and a superlattice stack located on the initial layer is provided. The initial layer includes aluminum nitride (AlN), and the superlattice stack includes a plurality of first films, a plurality of second films, and at least one doped layer. The first films and the second films are alternately stacked on the initial layer. The at least one doped layer is arranged in one of the first films and the second films, and dopants of the at least one doped layer are selected from a group consisting of carbon, iron, and the combination thereof.

In the semiconductor device provided in an embodiment of the disclosure, dopants are implanted into at least one film in the superlattice stack, so as to form the doped layer. Thereby, conductivity of the superlattice stack can be reduced (i.e., the degree of insulation of the superlattice stack can be enhanced), and the breakdown voltage of the semiconductor device can be raised effectively. Compared to the films having no dopants, the films with the dopants have unfavorable crystallinity and roughness. In the disclosure, the films having no dopants are grown in an epitaxial manner above the film layers with the dopants in the semiconductor device. Since the films having no dopants can have satisfactory crystallinity and roughness, crystallinity and roughness of the epitaxy layer can also be recovered. More specifically, in the superlattice stack of the disclosure, the films having no dopants are grown in an epitaxial manner above the doped layer with dopants and unfavorable crystallinity and roughness, so as to recover and enhance crystallinity and roughness of the epitaxy layer; thereafter, another doped layer with the dopant is grown in an epitaxial manner. The films (having no dopant) and the doped layers (having dopants) are alternately grown in an epitaxial manner according to the disclosure, such that the breakdown voltage of the semiconductor device can be raised (due to the arrangement of the films with the dopants), and that the resultant semiconductor device can have favorable crystallinity and roughness (due to the arrangement of the films having no dopant).

The dopants are implanted into the films of the superlattice stack of the semiconductor device, which results in the issue of bowing of the entire semiconductor device. Accordingly, wafers applied for making the semiconductor device may be cracked. In the exemplary embodiments of the disclosure, the films with no dopant are inserted between the doped layers having the dopants, so as to prevent the superlattice stack from being completely composed of the doped layers with the dopants. Thereby, the issue of bowing of the entire semiconductor device can be resolved to a greater extent. Besides, the concentration of gallium (Ga) in the superlattice stack also leads to the issue of the bowing of the entire semiconductor device. In the exemplary embodiments of the disclosure, the increase in the concentration of aluminum (Al) (i.e., the decrease in the concentration of Ga) lessens the issue of the bowing of the entire semiconductor device. Specifically, the films having Al with high concentration can be inserted between the films having Ga with high concentration, so as to resolve the issue of bowing caused by the gallium in the films and further resolve the issue of bowing of the entire semiconductor device to a greater extent.

Hence, in the disclosure, the first and second films in the superlattice stack are alternately grown in an epitaxial manner, such that the breakdown voltage of the semiconductor device can be raised, and that the issue of the bowing of the entire semiconductor device can be resolved. As a result, in the subsequent cooling process following the epitaxial process, the wafers for manufacturing the semiconductor device are neither cracked nor broken due to the issue of bowing.

Several exemplary embodiments accompanied with figures are described in detail below to further describe the disclosure in details. It should be understood, however, that the above may not contain all of the aspects and embodiments of the disclosure and may not mean to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide further understanding, and are incorporated in and constitute

DETAILED DESCRIPTION OF DISCLOSED EMBODIMENTS

The foregoing description of the embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the disclosure and its best mode practical application, thereby to enable persons skilled in the art to understand the disclosure for various embodiments and with various modifications as are suited to the particular use or implementation contemplated. It is intended that the scope of the disclosure be defined by the claims appended hereto and their equivalents in which all terms are meant in their broadest reasonable sense unless otherwise indicated.

Figure 1:
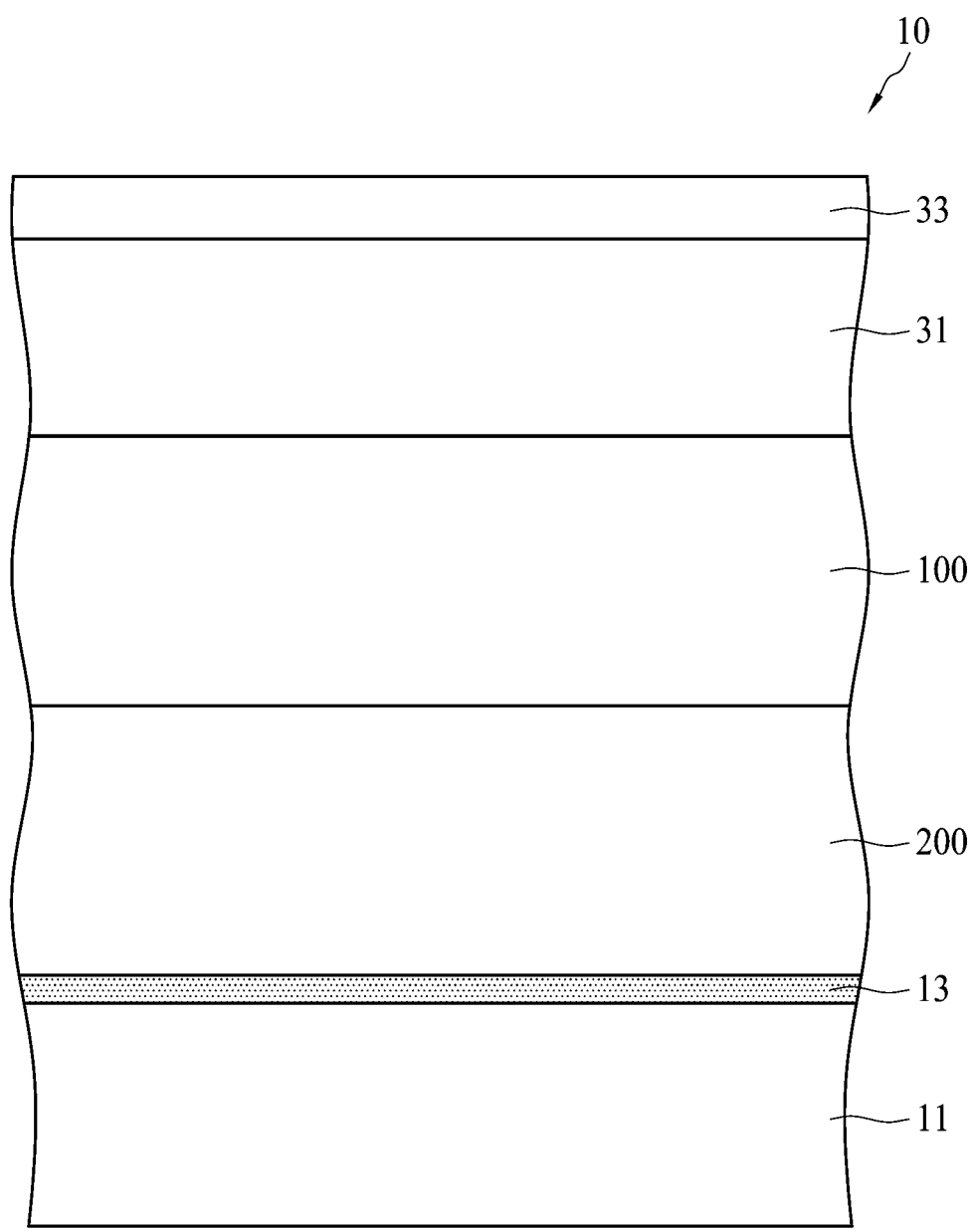
FIG. 1 is a schematic cross-sectional view of a semiconductor device according to an embodiment of the disclosure.

FIG. 1 is a schematic cross-sectional view of a semiconductor device 10 according to an embodiment of the disclosure. In an embodiment of the disclosure, the semiconductor device 10 includes a substrate 11, an initial layer 13 arranged on the substrate 11, and a superlattice stack 100 arranged on the initial layer 13. In an embodiment of the disclosure, the semiconductor device 10 further includes a buffer stack 200, an electron transport layer 31, and an electron supply layer 33. The buffer stack 200 is located between the initial layer 13 and the superlattice stack 100, and the electron transport layer 31 and the electron supply layer 33 are arranged on the superlattice stack 100.

In an embodiment of the disclosure, the substrate 11 is a silicon substrate or a substrate having a silicon surface, such as Si(111), Si(100), Si(110), a textured Si surface, silicon on insulation (SOI), silicon on sapphire (SOS), and a silicon wafer bonded to other materials (AlN, diamond, or any other polycrystalline material). A substrate that can be applied to replace the Si substrate includes a SiC substrate, a sapphire substrate, a GaN substrate, and a gallium arsenide (GaAs) substrate. The substrate 11 may be a half-insulating substrate or a conductive substrate.

In an exemplary embodiment of the disclosure, the initial layer 13 is arranged on the substrate 11, and the initial layer 13 includes AlN. In an exemplary embodiment of the disclosure, the initial layer 13 is grown on the Si substrate having an upper surface of (111) plane in an epitaxial manner, and the thickness of the initial layer 13 is about 200 nm. During the epitaxial growth of the AlN layer, a mixture having trimethyl amine (TMA) and ammonia ($NH_3$) is applied as a reactive gas to form the initial layer 13 on the Si substrate. A concentration of carbon in the initial layer 13 is substantially lower than $1E16/cm^3$.

In an exemplary embodiment of the disclosure, 2DEG is generated around the boundary between the electron transport layer 31 and the electron supply layer 33. Here, 2DEG is generated in the semiconductor device 10 due to spontaneous polarization and piezoelectric polarization, which results from the fact that the compound semiconductor (GaN) of the electron transport layer 31 and the compound semiconductor (AlGaN) of the electron supply layer 33 are made of hetero materials.

Figure 2:
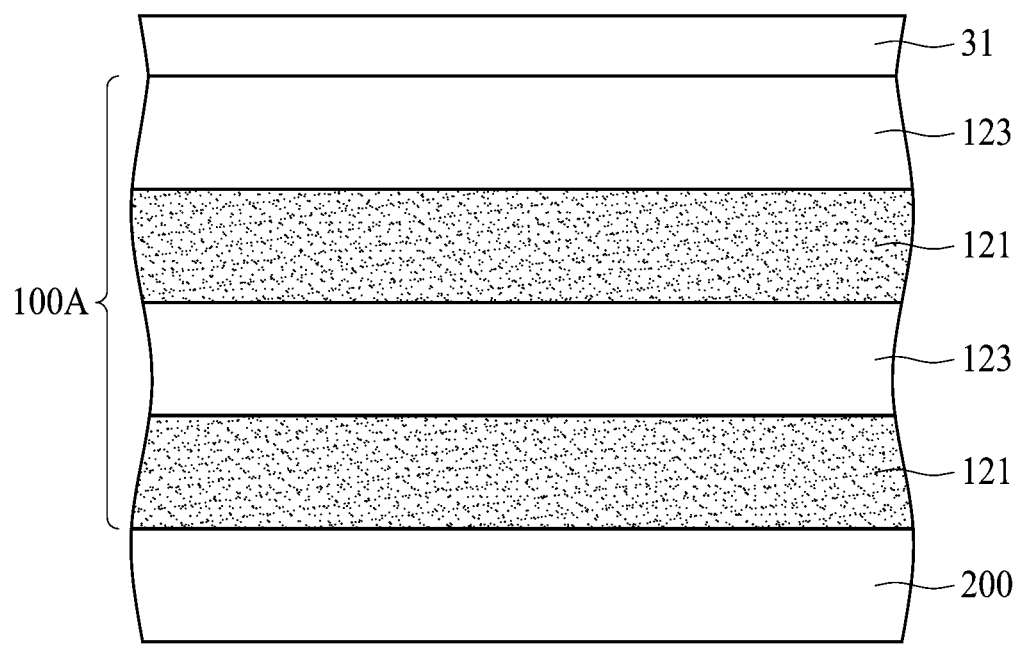
FIG. 2 is a schematic cross-sectional view of a superlattice stack according to an embodiment of the disclosure.

FIG. 2 is a schematic cross-sectional view of a superlattice stack 100A according to an embodiment of the disclosure. Here, the superlattice stack 100A may act as the superlattice stack 100 shown in FIG. 1. In an exemplary embodiment of the disclosure, the superlattice stack 100A includes a plurality of first films 121 and a plurality of second films 123. The first films 121 and the second films 123 are alternately stacked on the buffer stack 200. Here, the first films 121 are doped layers having dopants selected from a group consisting of carbon, iron and the combination thereof, and the second films 123 do not include dopants (carbon or iron) substantially. In an exemplary embodiment of the disclosure, the first films 121 include $Al_xGa_{1-x}N$, the second films 123 include $Al_yGa_{1-y}N$, and the concentrations of Al in the first films 121 are different from the concentrations of Al in the second films 123 (i.e., X is not equal to Y). Besides, X and Y are between 0 and 1 and are neither equal to 0 nor equal to 1. In an exemplary embodiment of the disclosure, the first films 121 include AlN, the second films 123 include $Al_yGa_{1-y}N$, i.e., X is equal to 1, and Y is between 0 and 0.35 and is neither equal to 0 nor equal to 0.35. In an exemplary embodiment of the disclosure, the first films 121 include AlN, the second films 123 include GaN, i.e., X is equal to 1, and Y is equal to 0.

Figure 3:
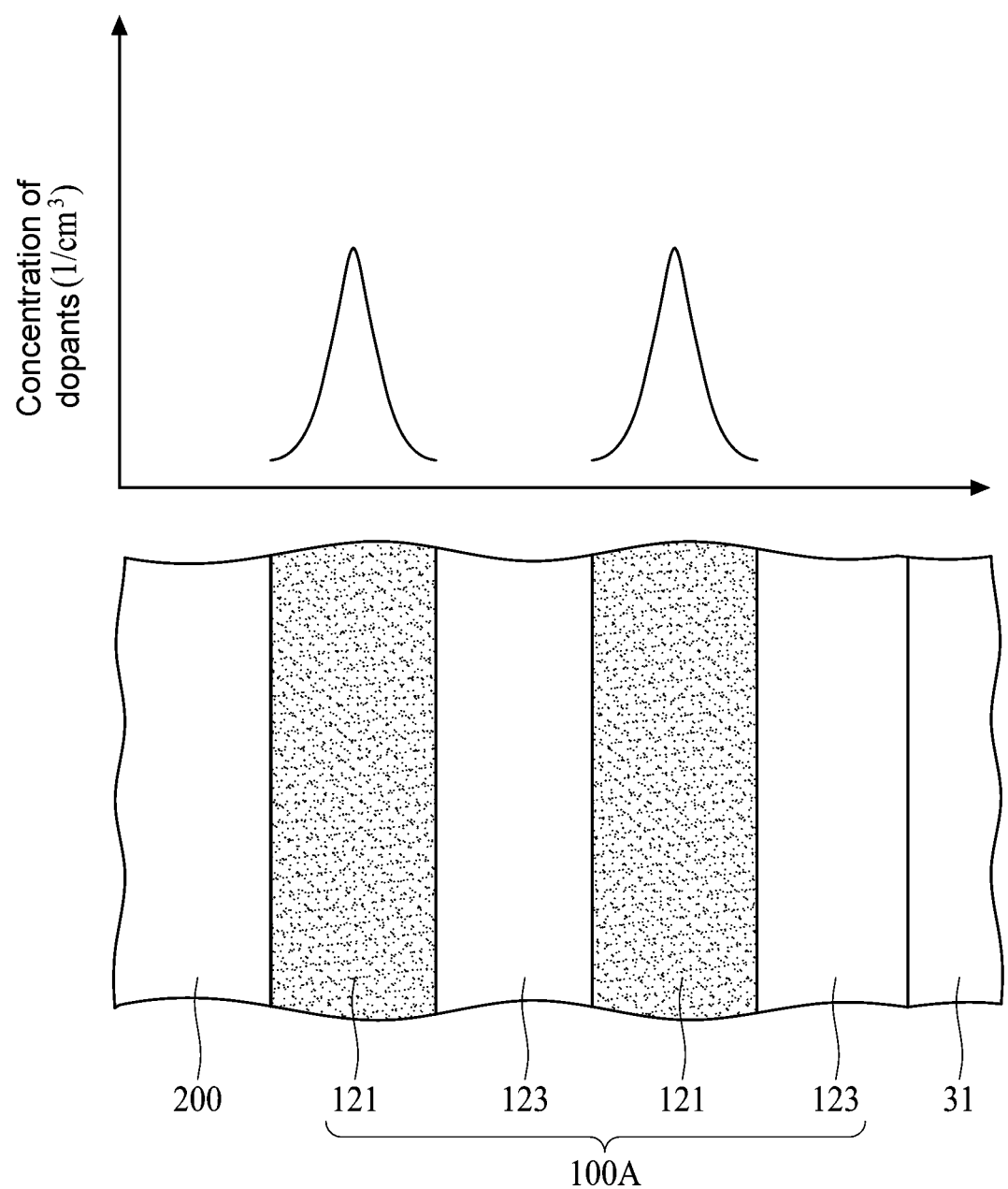
FIG. 3 schematically illustrates variations in concentrations of dopants in a semiconductor device according to an embodiment of the disclosure.

FIG. 3 schematically illustrates variations in concentrations of dopants in a superlattice stack according to an embodiment of the disclosure. In an exemplary embodiment of the disclosure, a concentration of the dopants in the superlattice stack 100A varies in a non-continuous manner, e.g., in a δ-like manner, as shown in FIG. 3. In an exemplary embodiment of the disclosure, the concentration of dopants in two doped layers in the superlattice stack 100A may remain unchanged substantially (as shown in FIG. 3), gradually increase, or gradually decrease. In an exemplary embodiment of the disclosure, the concentrations of dopants in the first films 121 (i.e., the doped layers) are higher than concentrations of dopants in other regions (e.g., the second films 123). The concentrations of the dopants increase from the second films 123 to the first films 121 and decrease from the first films 121 to the second films 123. In an exemplary embodiment of the disclosure, the concentrations of the dopants in the first films 121 is between $1E17/cm^3$ and $1E20/cm^3$, and the concentrations of dopants in regions other than the first films 121 (e.g., the second films 123) is lower than $1E17/cm^3$.

In the semiconductor device provided in an embodiment of the disclosure, dopants are implanted into at least one film in the superlattice stack 100A, so as to form the doped layer. Thereby, conductivity of the superlattice stack 100A can be reduced (i.e., the degree of insulation of the superlattice stack 100A can be enhanced), and the breakdown voltage of the semiconductor device can be raised effectively. Compared to the second films 123 with no dopants, the doped layers (i.e., the first films 121) with the dopants have unfavorable crystallinity and roughness. In the semiconductor device provided herein, the second films 123 having no dopants are grown in an epitaxial manner above the doped layers 121 (the first films 121) with the dopants. Since the second films 123 have no dopants, the crystallinity and roughness of the second films 123 are relatively satisfactory; thereby, crystallinity and roughness of the epitaxy layer can be recovered. More specifically, the second films 123 having no dopants are grown in an epitaxial manner above the doped layers (the first films 121 with dopants and unfavorable crystallinity and roughness), so as to recover and enhance crystallinity and roughness of the epitaxy layer; thereafter, another doped layer (the first film 121) with the dopant is grown in an epitaxial manner. The second films 123 (having no dopant) and the first films 121 (having dopants) are alternately grown in an epitaxial manner according to the disclosure, such that the breakdown voltage of the semiconductor device can be raised (due to the arrangement of the first films 121 with the dopants), and that the resultant semiconductor device can have favorable crystallinity and roughness (due to the arrangement of the second films 123 having no dopant).

The dopants are implanted into the films of the superlattice stack 100A of the semiconductor device, which results in the issue of bowing of the entire semiconductor device. Accordingly, wafers applied for making the semiconductor device may be cracked. In an exemplary embodiment of the disclosure, the second films 123 with no dopants are inserted between the doped layers (the first films 121) having the dopants, so as to prevent the superlattice stack 100A from being completely composed of the doped layers (the first films 121) with the dopants. Thereby, the issue of bowing of the entire semiconductor device can be resolved to a greater extent. Besides, the concentration of Ga in the superlattice stack 100A also leads to the issue of the bowing of the entire semiconductor device. In an exemplary embodiment of the disclosure, the increase in the concentration of Al (i.e., the decrease in the concentration of Ga) lessens the issue of the bowing of the entire semiconductor device. Specifically, the films having Al with high concentration can be inserted between the films having Ga with high concentration, so as to resolve the issue of bowing caused by the gallium in the films and further resolve the issue of bowing of the entire semiconductor device to a greater extent.

Hence, in the disclosure, the first and second films 121 and 123 in the superlattice stack 100A of the semiconductor device are alternately grown in an epitaxial manner, such that the breakdown voltage of the semiconductor device can be raised, and that the issue of the bowing of the entire semiconductor device can be resolved. As a result, in the subsequent cooling process following the epitaxial process, the wafers for manufacturing the semiconductor device are neither cracked nor broken due to the issue of bowing.

Figure 4:
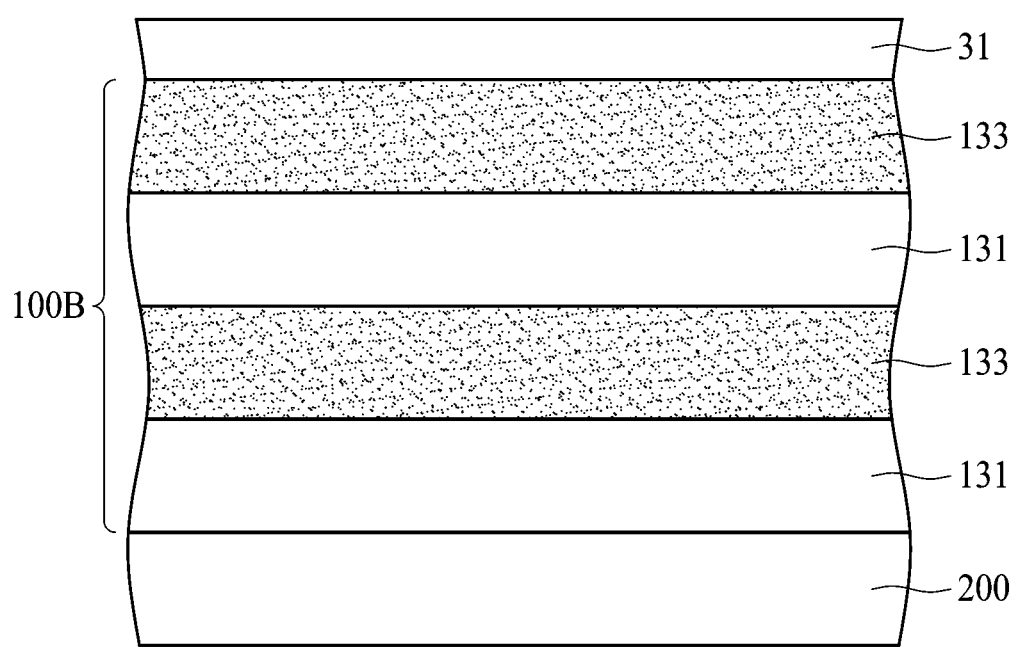
FIG. 4 is a schematic cross-sectional view of a superlattice stack according to an embodiment of the disclosure.

FIG. 4 is a schematic cross-sectional view of a superlattice stack 100B according to an embodiment of the disclosure. Here, the superlattice stack 100B may act as the superlattice stack 100 shown in FIG. 1. The same technical contents in the embodiment shown in FIG. 4 and in the superlattice stack 100A shown in FIG. 2 will not be further explained hereinafter. In an exemplary embodiment of the disclosure, the superlattice stack 100B includes a plurality of first films 131 and a plurality of second films 133. The first films 131 and the second films 133 are alternately stacked on the buffer stack 200. Here, the second films 133 are doped layers having dopants selected from a group consisting of carbon, iron and the combination thereof, and the first films 131 do not include dopants (carbon or iron) substantially. Compared to FIG. 2, which shows that the dopants are implanted into the first films 121 of the superlattice stack 100A, FIG. 4 shows that the dopants are implanted into the second films 133 of the superlattice stack 100B.

Figure 5:
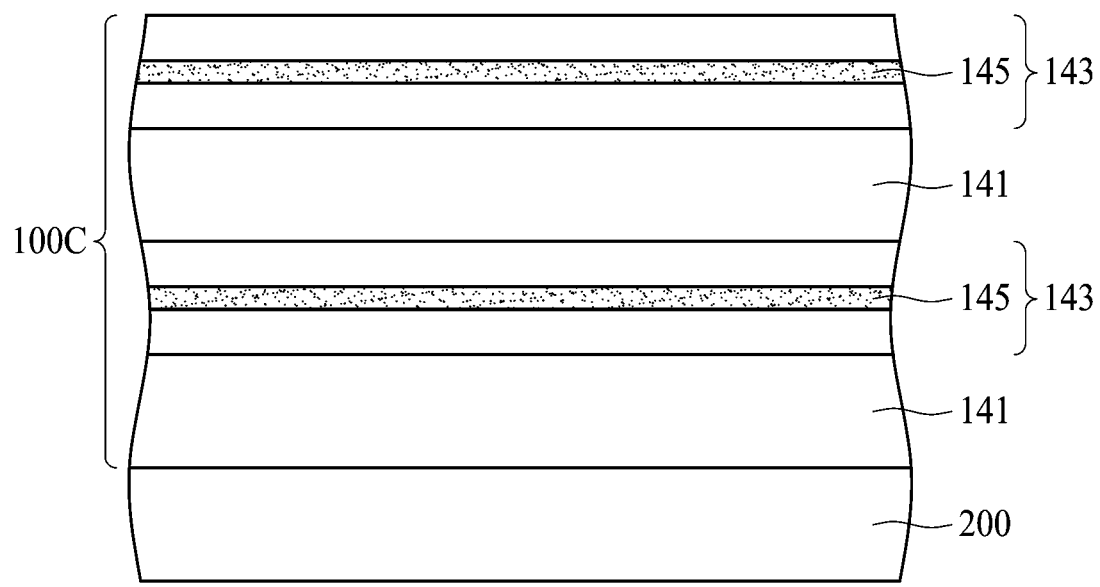
FIG. 5 is a schematic cross-sectional view of a superlattice stack according to an embodiment of the disclosure.

FIG. 5 is a schematic cross-sectional view of a superlattice stack 100C according to an embodiment of the disclosure. Here, the superlattice stack 100C may act as the superlattice stack 100 shown in FIG. 1. The same technical contents in the embodiment shown in FIG. 5 and in the superlattice stack 100A shown in FIG. 2 will not be further explained hereinafter. In an exemplary embodiment of the disclosure, the superlattice stack 100C includes a plurality of first films 141, a plurality of second films 143, and at least one doped layer 145. The first films 141 and the second films 143 are alternately stacked on the buffer stack 200. The doped layer 145 is located in the second films 143, and dopants in the doped layer 145 are selected from a group consisting of carbon, iron and the combination thereof. The first films 141 do not include dopants (carbon or iron) substantially. Compared to FIG. 2 which shows that the dopants are implanted into all regions of the first films 121 of the superlattice stack 100A, FIG. 5 shows that the dopants are implanted into some regions of the second films 143 of the superlattice stack 100C, so as to form the doped layer 145.

Figure 6:
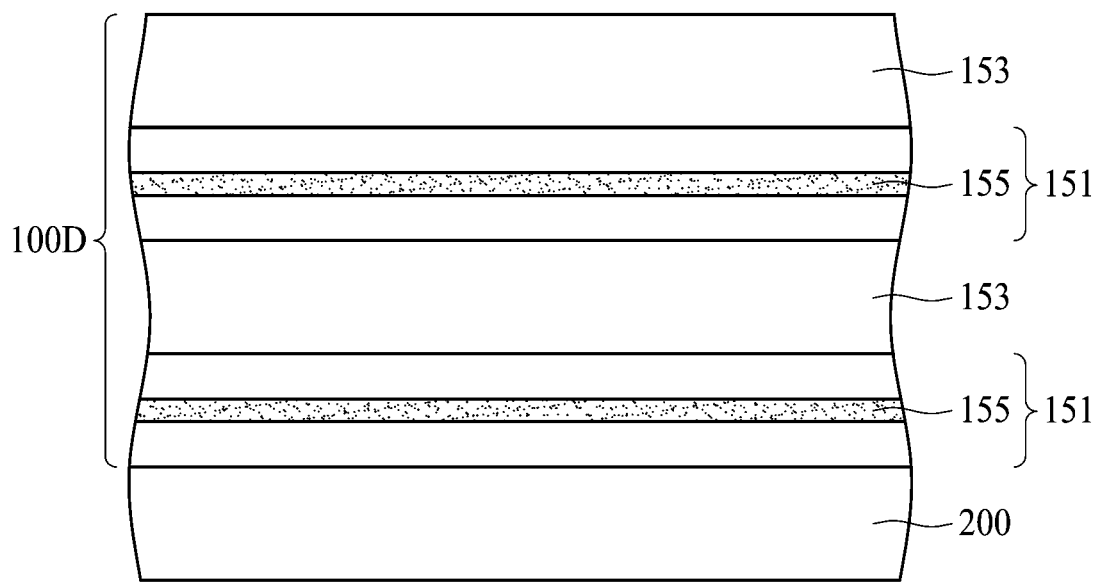
FIG. 6 is a schematic cross-sectional view of a superlattice stack according to an embodiment of the disclosure.

FIG. 6 is a schematic cross-sectional view of a superlattice stack 100D according to an embodiment of the disclosure. Here, the superlattice stack 100D may act as the superlattice stack 100 shown in FIG. 1. The same technical contents in the embodiment shown in FIG. 6 and in the superlattice stack 100A shown in FIG. 2 will not be further explained hereinafter. In an exemplary embodiment of the disclosure, the superlattice stack 100D includes a plurality of first films 151, a plurality of second films 153, and at least one doped layer 155. The first films 151 and the second films 153 are alternately stacked on the buffer stack 200. The doped layer 155 is located in the first films 151, and dopants in the doped layer 155 are selected from a group consisting of carbon, iron and the combination thereof. The second films 153 do not include dopants (carbon or iron) substantially. Compared to FIG. 2, which shows that the dopants are implanted into all regions of the first films 121 of the superlattice stack 100A, FIG. 6 shows that the dopants are implanted into some regions of the first films 151 of the superlattice stack 100D, so as to form the doped layer 155.

Figure 7:
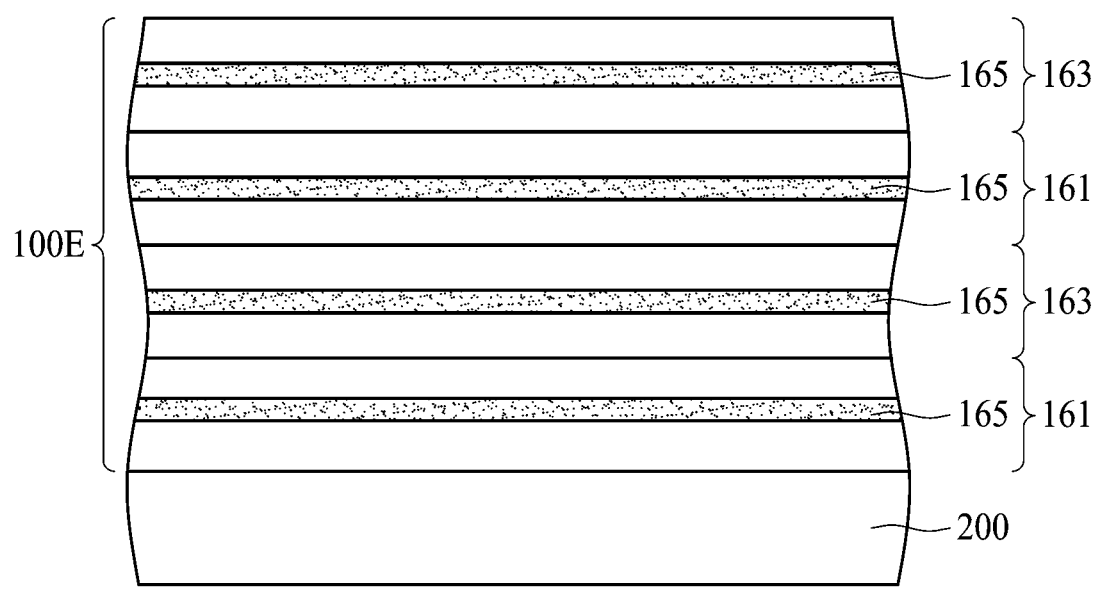
FIG. 7 is a schematic cross-sectional view of a superlattice stack according to an embodiment of the disclosure.

FIG. 7 is a schematic cross-sectional view of a superlattice stack 100E according to an embodiment of the disclosure. Here, the superlattice stack 100E may act as the superlattice stack 100 shown in FIG. 1. The same technical contents in the embodiment shown in FIG. 7 and in the superlattice stack 100A shown in FIG. 2 will not be further explained hereinafter. In an exemplary embodiment of the disclosure, the superlattice stack 100E includes a plurality of first films 161, a plurality of second films 163, and at least one doped layer 165. The first films 161 and the second films 163 are alternately stacked on the buffer stack 200. The doped layer 165 is located in the first films 161 and the second films 163, and dopants in the doped layer 165 are selected from a group consisting of carbon, iron and the combination thereof. Compared to FIG. 5 (which shows that a doped layer is formed in the second films of the superlattice stack 100C) and FIG. 6 (which shows that a doped layer is formed in the first films of the superlattice stack 100D), FIG. 7 shows that at least one doped layer 165 is formed in both of the first and second film layers 161 and 163 of the superlattice stack 100E.

Figure 8:
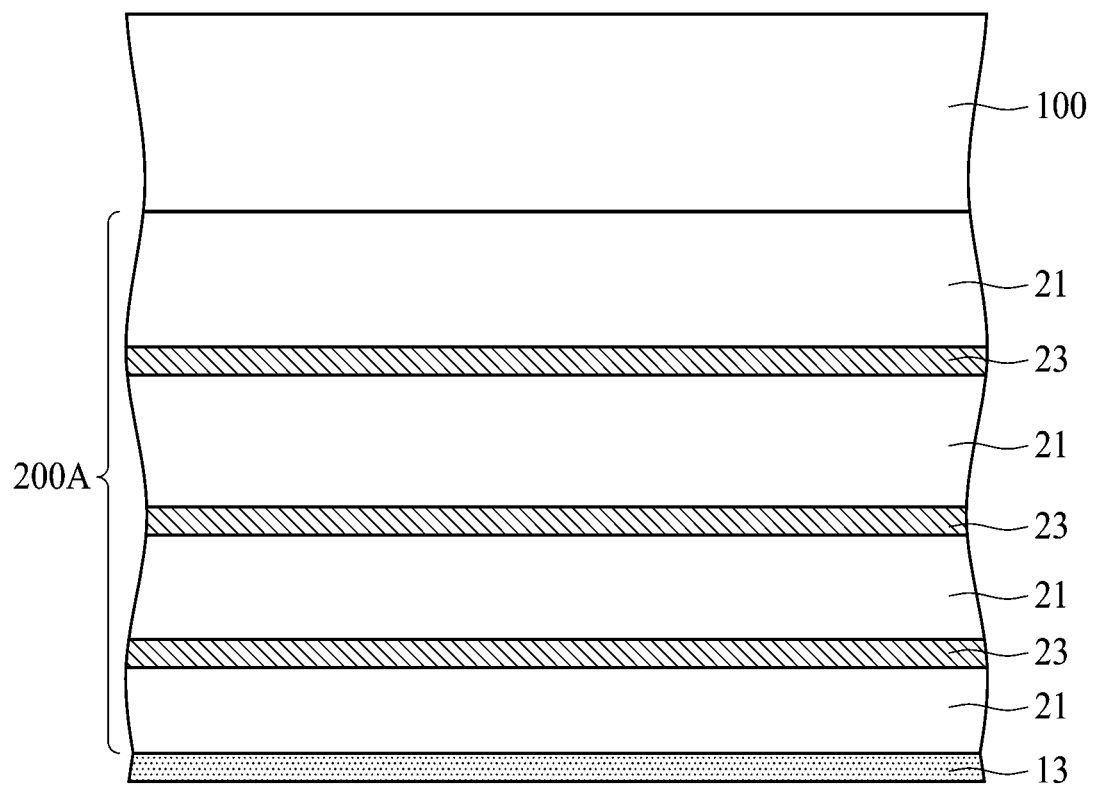
FIG. 8 is a schematic cross-sectional view of a buffer stack according to an embodiment of the disclosure.

FIG. 8 is a schematic cross-sectional view of a buffer stack 200A according to an embodiment of the disclosure. Here, the buffer stack 200A may act as the buffer stack 200 shown in FIG. 1. In an embodiment of the disclosure, the buffer stack 200A includes at least one doped layer 23 positioned between two adjacent base layers 21. In an embodiment of the disclosure, the buffer stack 200A includes a plurality of base layers 21 and a plurality of doped layers 23, and the doped layers 23 and the base layers 21 are alternately stacked on the initial layer 13. In an exemplary embodiment of the disclosure, the base layers 21 include AlGaN, and the doped layers 23 include AlGaN or BAlGaN. Dopants in the doped layers 23 include carbon or iron, and the base layers 21 do not contain dopants (carbon or iron) substantially. In an exemplary embodiment of the disclosure, the doped layers 23 may be C—AlGaN, C—BAlGaN, Fe—AlGaN, or Fe—BAlGaN.

In an exemplary embodiment of the disclosure, a thickness of the doped layer 23 is between 10 angstroms and 1 micrometer, and a ratio of the thickness of the doped layer 23 to a thickness of each base layer 21 is between 0.001 and 1.0. In an exemplary embodiment of the disclosure, a concentration of the dopants in the doped layer 23 is between $1E17/cm^3$ and $1E20/cm^3$, and a concentration of dopants in each base layer 21 is lower than $1E17/cm^3$.

In an exemplary embodiment of the disclosure, the buffer stack 200A includes four base layers 21. Concentrations of Al in the base layers 21 from bottom to top are x1, x2, x3, and x4, respectively, concentrations of Ga in the base layers 21 from bottom to top are 1-x1, 1-x2, 1-x3, and 1-x4, respectively, and x1>x2>x3>x4. That is, the concentrations of Al in the base layers 21 of the buffer stack 200A gradually decrease from bottom to top, and the concentrations of Ga in the base layers 21 gradually increase from bottom to top.

In an exemplary embodiment of the disclosure, concentrations of Al in the doped layers 23 are y1, y2, and y3 from bottom to top. Here, y1=y2=y3, y1≠y2≠y3, y1>y2>y3, or y1<y2<y3. In an exemplary embodiment of the disclosure, x4<y3<x3<y2<x2<y1<x1.

In an embodiment of the disclosure, the buffer stack 200A includes four base layers 21 and three doped layers 23. Thicknesses of the four base layers 21 from bottom to top are da1, da2, da3, and da4, respectively, Here, da1=da2=da3=da4, da1≠da2≠da3≠da4, da1>da2>da3>da4, or da1<da2<da3<da4. Thicknesses of the three doped layers 23 from bottom to top are dc1, dc2, and dc3, respectively, Here, dc1=dc2=dc3, dc1≠dc2≠dc3, dc1>dc2>dc3, or dc1<dc2<dc3.

In an exemplary embodiment of the disclosure, the base layer 21 (having no dopants) at the bottom of the buffer stack 200A is in contact with the initial layer 13, and the base layer 21 (having no dopants) at the top of the buffer stack 200A is in contact with the superlattice stack 100. That is, the doped layers 23 having the dopants in the buffer stack 200A of the semiconductor device are neither in contact with the initial layer 13 nor in contact with the electron transport layer 31.

In an exemplary embodiment of the disclosure, a concentration of the dopants in the buffer stack 200A varies in a non-continuous manner, e.g., in a δ-like manner, as shown in FIG. 3. In an exemplary embodiment of the disclosure, the concentration of dopants in three doped layers 23 in the buffer stack 200A may remain unchanged substantially (as shown in FIG. 3), gradually increase, or gradually decrease.

In an exemplary embodiment of the disclosure, the concentration of dopants in the doped layer 23 is higher than a concentration of dopant in regions other than the doped layer 23, i.e., the concentration of the dopants increases from the base layer 21 to the doped layer 23 and decreases from the doped layer 23 to the base layer 21.

In an exemplary embodiment of the disclosure, the doped layer 23 with the dopants is inserted into the buffer stack 200A of the semiconductor device, so as to reduce the conductivity of the buffer stack 200A (i.e., enhance the degree of insulation of the buffer stack 200A) and further raise the breakdown voltage of the semiconductor device effectively. Compared to the base layers 21 with no dopants, the doped layer 23 with the dopants has unfavorable crystallinity and roughness. In order to resolve the issue of crystallinity and roughness of the doped layer 23 having the dopants, the base layers 21 having no dopants are grown in an epitaxial manner above the doped layer 23 with the dopants in the semiconductor device, so as to recover crystallinity and roughness of the epitaxy layer (the base layers 21 have no dopants and thus can have satisfactory crystallinity and roughness). More specifically, the base layers 21 having no dopants are grown in an epitaxial manner above the doped layer 23 with dopants and unfavorable crystallinity and roughness, so as to recover and enhance crystallinity and roughness of the epitaxy layer; thereafter, another doped layer 23 with the dopant is grown in an epitaxial manner. The base layers 21 (having no dopant) and the doped layer 23 (having dopants) are alternately grown in an epitaxial manner according to the disclosure, such that the breakdown voltage of the semiconductor device can be raised (due to the arrangement of the doped layer 23 with the dopants), and that the resultant semiconductor device can have favorable crystallinity and roughness (due to the arrangement of the based layers 21 having no dopant).

The dopants are implanted into the films of the buffer stack 200A of the semiconductor device, which results in the issue of bowing of the entire semiconductor device. Accordingly, wafers applied for making the semiconductor device may be cracked. In an exemplary embodiment of the disclosure, in the semiconductor device, the base layers 21 with no dopants are inserted between the doped layers 23 having the dopants, so as to prevent the buffer stack 200A from being completely composed of the doped layers 23 with the dopants. Thereby, the issue of bowing of the entire semiconductor device can be resolved to a greater extent.

Hence, in the disclosure, the base layers 21 (having no dopant) and the doped layers 23 (having dopants) are alternately grown in an epitaxial manner, such that the breakdown voltage of the semiconductor device can be raised, and that the issue of bowing of the entire semiconductor device can be resolved. As a result, in the subsequent cooling process following the epitaxial process, the semiconductor device is neither cracked nor broken due to the issue of bowing.

Figure 9:
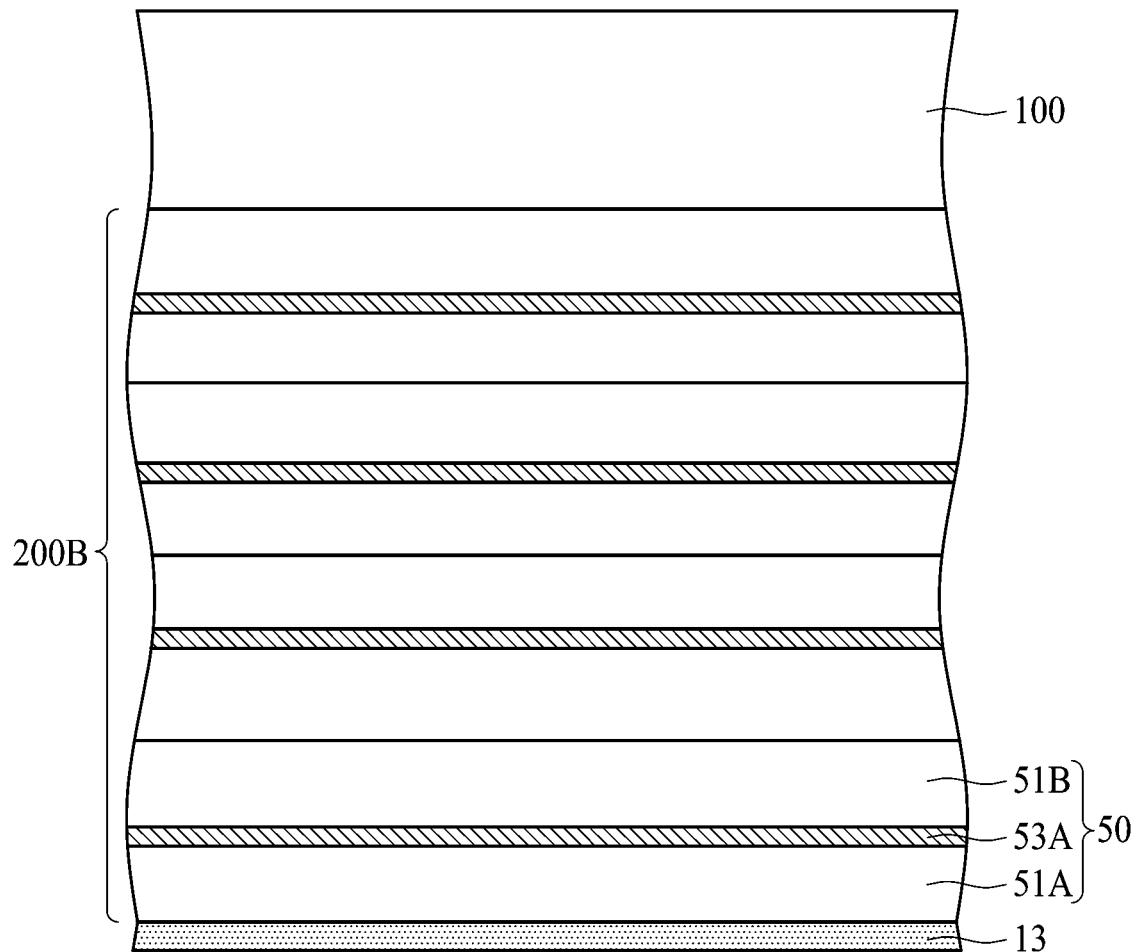
FIG. 9 is a schematic cross-sectional view of a buffer stack according to an embodiment of the disclosure.

FIG. 9 is a schematic cross-sectional view of a buffer stack 200B according to an embodiment of the disclosure. Here, the buffer stack 200B may act as the buffer stack 200 shown in FIG. 1. The same technical contents in the embodiment shown in FIG. 9 and in the buffer stack 200A shown in FIG. 8 will not be further explained hereinafter. In an embodiment of the disclosure, the buffer stack 200B includes at least one stack unit 50. In an embodiment of the disclosure, at least one stack unit 50 includes a first base layer 51A, a first doped layer 53A, and a second base layer 51B. The first doped layer 53A is positioned between the first base layer 51A and the second base layer 51B, i.e., the first doped layer 53A is located inside the stack unit 50.

Compared to FIG. 8 (which shows that the base layers 21 and the doped layers 23 are alternately stacked in the buffer stack 200A), FIG. 9 shows that the buffer stack is achieved by applying the stack unit 50 having a sandwich-like film structure in the buffer stack 200B. In an exemplary embodiment of the disclosure, each stack unit 50 includes a first base layer 51A, a first doped layer 53A, and a second base layer 51B. The first base layer 51A and the second base layer 51B include AlGaN, and the first doped layer 53A includes AlGaN or BAlGaN. The first doped layer 53A is positioned between the first base layer 51A and the second base layer 51B. A concentration of Al of the first base layer 51A and a concentration of Al of the second base layer 51B are substantially the same. Dopants in the first doped layer 53A include carbon or iron, and the first base layer 51A and the second base layer 51B do not contain dopants (carbon or iron) substantially. In an exemplary embodiment of the disclosure, the first doped layer 53A may be C—AlGaN, C—BAlGaN, Fe—AlGaN, or Fe—BAlGaN.

In an exemplary embodiment of the disclosure, a thickness of the first doped layer 53A of the stack unit 50 is between 10 angstroms and 1 micrometer, and a ratio of the thickness of the first doped layer 53A to a thickness of the first base layer 51A (or the second base layer 51B) is between 0.001 and 1.0. In an exemplary embodiment of the disclosure, a concentration of the dopant in the first doped layer 53A is between $1E17/cm^3$ and $1E20/cm^3$, and a concentration of dopant in the first base layer 51A (or the second base layer 51B) is less than $1E17/cm^3$.

In an exemplary embodiment of the disclosure, the buffer stack 200B includes four stack units 50. The compositions of the first base layer 51A and the second base layer 51B are substantially the same. Concentrations of Al in the stack units 50 from bottom to top are x1, x2, x3, and x4, respectively, concentrations of Ga in the stack units 50 from bottom to top are 1-x1, 1-x2, 1-x3, and 1-x4, respectively, and x1>x2>x3>x4. That is, the concentrations of Al in the first base layers 51A (or the second base layers 51B) of the four stack units 50 gradually decrease from bottom to top, and the concentrations of Ga in the first base layers 51A (or the second base layers 51B) of the four stack units 50 gradually increase from bottom to top. In an exemplary embodiment of the disclosure, concentrations of Al in the four first doped layers 53A from bottom to top are y1, y2, y3, and y4, respectively. Here, y1=y2=y3=y4, y1≠y2≠y3≠y4, y1>y2>y3>y4, or y1<y2<y3<y4.

In an exemplary embodiment of the disclosure, the buffer stack 200B includes four stack units 50. Thicknesses of the first and second base layers 51A and 51B are substantially the same. The thicknesses of the first base layers 51A (or the second base layers 51B) from bottom to top are da1, da2, da3, and da4, respectively. Here, da1=da2=da3=da4, da1≠da2≠da3≠da4, da1>da2>da3>da4, or da1<da2<da3<da4. Thicknesses of the four first doped layers 53A from bottom to top are dc1, dc2, dc3, and dc4, respectively. Here, dc1=dc2=dc3=dc4, dc1≠dc2≠dc3 dc4, dc1>dc2>dc3>dc4, or dc1<dc2<dc3<dc4.

Figure 10:
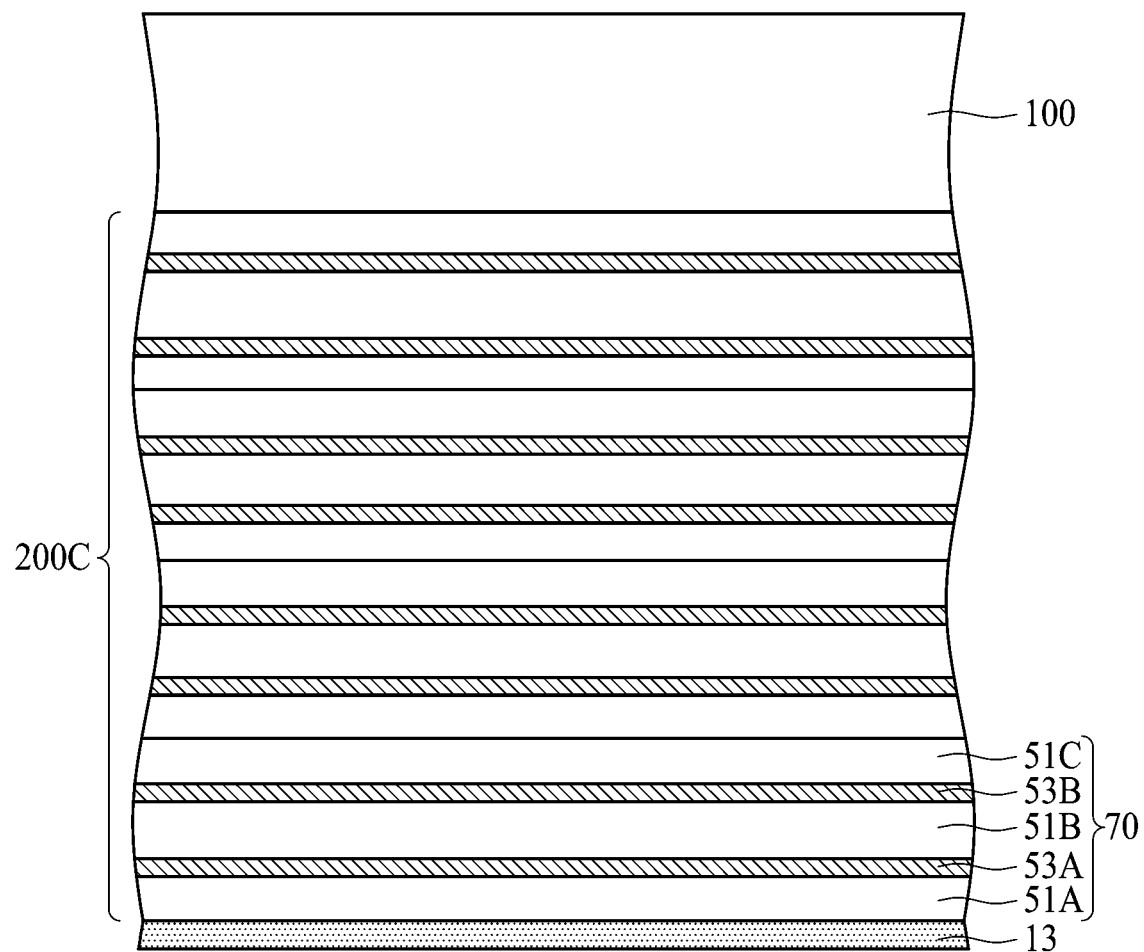
FIG. 10 is a schematic cross-sectional view of a buffer stack according to an embodiment of the disclosure.

FIG. 10 is a schematic cross-sectional view of a buffer stack 200C according to an embodiment of the disclosure. Here, the buffer stack 200C may act as the buffer stack 200 shown in FIG. 1. The same technical contents in the embodiment shown in FIG. 10 and in the buffer stacks shown in FIG. 8 and FIG. 9 will not be further explained hereinafter. Compared to the semiconductor device shown in FIG. 8 (i.e., the buffer stack is achieved by applying a plurality of sandwich-like film structures), the buffer stack 200C shown in FIG. 10 has a plurality of stack units 70 having five-layer structure.

In an embodiment of the disclosure, the stack unit 70 of the semiconductor device further includes a second doped layer 53B and a third base layer 51C besides a first base layer 51A, a first doped layer 53A, and a second base layer 51B. The second doped layer 53B is positioned between the second base layer 51B and the third base layer 51C.

In an exemplary embodiment of the disclosure, the third base layer 51C includes AlGaN, and the second doped layer 53B includes AlGaN or BAlGaN. In an exemplary embodiment of the disclosure, the dopants in the second doped layer 53B include carbon or iron, and the second doped layer 51B may be C—AlGaN, C—BAlGaN, Fe—AlGaN, or Fe—BAlGaN. In each stack unit 70, concentrations of Al in the first base layer 51A, the second base layer 51B, and the third base layer 51C are substantially the same and do not contain dopants (carbon or iron) substantially.

To sum up, in the buffer stack depicted in FIG. 10, two doped layers are inserted between the base layers composed of AlGaN, so as to form the buffer stack. The concentrations of dopants in the two doped layers may the same or different. By contrast, in the buffer stack 200B depicted in FIG. 9, one doped layer is inserted between the base layers composed of AlGaN, so as to form the buffer stack 200B. Alternatively, as shown in FIG. 9, three or more doped layers may be inserted between the base layers composed of AlGaN, so as to form the buffer stack.

In the semiconductor device provided in an embodiment of the disclosure, dopants are implanted into at least on film (or a partial region) in the superlattice stack, so as to form the doped layer. Thereby, conductivity of the superlattice stack can be reduced (i.e., the degree of insulation of the superlattice stack can be enhanced), and the breakdown voltage of the semiconductor device can be raised effectively. Compared to the films with no dopants, the films with the dopants have unfavorable crystallinity and roughness. In the semiconductor device provided herein, the films having no dopants are grown in an epitaxial manner above the films with the dopants. Since the films with no dopants can have favorable crystallinity and roughness, crystallinity and roughness of the epitaxy layer can also be recovered. More specifically, the films having no dopants are grown in an epitaxial manner above the doped layers with dopants and unfavorable crystallinity and roughness, so as to recover and enhance crystallinity and roughness of the epitaxy layer; thereafter, another doped layer with the dopant is grown in an epitaxial manner. The films (having no dopant) and the doped layers (having dopants) are alternately grown in an epitaxial manner according to the disclosure, such that the breakdown voltage of the semiconductor device can be raised (due to the arrangement of the doped layers with the dopants), and that the resultant semiconductor device can have favorable crystallinity and roughness (due to the arrangement of the films having no dopant).

The dopants are implanted into the films of the superlattice stack of the semiconductor device, which results in the issue of bowing of the entire semiconductor device. Accordingly, wafers applied for making the semiconductor device may be cracked. In an exemplary embodiment of the disclosure, the films with no dopants are inserted between the doped layers having the dopants, so as to prevent the superlattice stack from being completely composed of the doped layers with the dopants. Thereby, the issue of bowing of the entire semiconductor device can be resolved to a greater extent. Besides, the concentration of Ga in the superlattice stack also leads to the issue of the bowing of the entire semiconductor device. In an exemplary embodiment of the disclosure, the increase in the concentration of Al lessens the issue of the bowing of the entire semiconductor device. Specifically, the films having Al with high concentration can be inserted between the films having Ga with high concentration, so as to resolve the issue of bowing caused by Ga in the films and further resolve the issue of bowing of the entire semiconductor device to a greater extent.

Hence, in the disclosure, the first and second films in the superlattice stack are alternately grown in an epitaxial manner, such that the breakdown voltage of the semiconductor device can be raised, and that the issue of the bowing of the entire semiconductor device can be resolved. As a result, in the subsequent cooling process following the epitaxial process, the wafers for manufacturing the semiconductor device are neither cracked nor broken due to the issue of bowing.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents. Moreover, no element and component in the present disclosure is intended to be dedicated to the public regardless of whether the element or component is explicitly recited in the following claims.

What is claimed is:

1. A semiconductor device, comprising:
   a substrate;
   an initial layer located on the substrate, the initial layer comprising aluminum nitride; and
   a superlattice stack located on the initial layer, the superlattice stack comprising a plurality of first films, a plurality of second films, and at least one doped layer, the plurality of first films and the plurality of second films being alternately stacked on the initial layer, wherein the at least one doped layer is arranged in the plurality of first films and/or the plurality of second films, and dopants of the at least one doped layer are selected from a group consisting of carbon, iron, and the combination thereof;
   a buffer stack located between the superlattice stack and the initial layer, wherein the buffer stack comprises a plurality of stack units, and each of the plurality of stack units comprises a first base layer, a first doped layer, a second base layer, a second doped layer and a third base layer,
   wherein the first doped layer is positioned between and in contact with the first base layer and the second base layer, and the second doped layer is positioned between and in contact with the second base layer and the third base layer,
   a concentration of aluminum in the first base layer, a concentration of aluminum in the second base layer and a concentration of aluminum in the third base layer are the same in a same stack unit of the plurality of stack units, the first base layer, the second base layer and the third base layer of each of the plurality of stack units comprise aluminum gallium nitride, and the first base layer, the second base layer and the third base layer of each of the plurality of stack units do not comprise carbon or irons,
   wherein the plurality of stack units comprises a first stack unit and a second stack unit located between the first stack unit and the superlattice stack, and the concentration of aluminum in the first base layer of the first stack unit is larger than the concentration of aluminum in the first base layer of the second stack unit.

2. The semiconductor device of claim 1, wherein the plurality of first films comprise $Al_xGa_{1-x}N$ or aluminum nitride, the plurality of second films comprise $Al_yGa_{1-y}N$ or gallium nitride, X and Y are between 0 and 1 and are neither equal to 0 nor equal to 1, and X is not equal to Y.

3. The semiconductor device of claim 1, wherein the at least one doped layer is located in the plurality of first films, and the plurality of second films do not comprise carbon or iron.

4. The semiconductor device of claim 1, wherein the at least one doped layer is located in the plurality of second films, and the plurality of first films do not comprise carbon or iron.

5. The semiconductor device of claim 1, wherein the at least one doped layer is located in the plurality of first films and the plurality of second films.

6. The semiconductor device of claim 1, wherein the first doped layer and the second doped layer comprise aluminum gallium nitride or boron aluminum gallium nitride.

* * * * *